United States Patent [19]

Rodden

[11] 4,313,521

[45] Feb. 2, 1982

[54] SPEAKER HOUSING

[76] Inventor: M. Raymond Rodden, 4917 S. Braden Apt. 11F, Tulsa, Okla. 74135

[21] Appl. No.: 159,790

[22] Filed: Jun. 16, 1980

[51] Int. Cl.$^{3}$ .............................................. H05K 5/00

[52] U.S. Cl. .................................... 181/145; 181/146; 181/147; 181/151; 181/155; 181/160

[58] Field of Search ................................ 181/144–148, 181/151, 155–156, 199, 160; 179/109, 146 E

[56] References Cited

U.S. PATENT DOCUMENTS

| | | | |
|---|---|---|---|
| 2,034,014 | 3/1936 | Wheeler et al. | 181/151 |
| 2,816,619 | 12/1957 | Karlson | 181/148 |
| 4,215,761 | 8/1980 | Andrews | 181/160 X |

*Primary Examiner*—Joseph W. Hartary

*Assistant Examiner*—Thomas H. Tarcza

*Attorney, Agent, or Firm*—Head & Johnson

[57] ABSTRACT

An improved loudspeaker housing including a closed chamber in the shape of a triangular right prism closed at both ends. All of the three walls of the prism and rectangular in shape and two of the walls are at right angles to each other. A circular opening in a first of the two walls adjacent the right angle is provided for a loudspeaker which is attached to the outside of the first wall with the sound output of the speaker directed against the third, or hypotenuse, wall of the prism. An opening is provided in the third wall which is in the shape of an exponentially widening gap. A box is placed over the outside of the first wall enclosing the loudspeaker, and is lined inside with sound absorbing material.

10 Claims, 8 Drawing Figures

SPEAKER HOUSING

BACKGROUND OF THE INVENTION

1. Field of the Invention

This invention lies in the field of sound reproducing apparatus. More particularly it concerns a housing or cabinet for a loudspeaker, for the reproduction of sound with a greater fidelity than is otherwise available.

2. Description of the Prior Art

In the sound reproduction art there are numerous examples of loudspeaker cabinets for which claims of high fidelity and high energy output are made. Many of these include large folded exponential horns, which are expensive to construct, and bulky and heavy to transport. Others are made in the form of simple rectangular boxes, and so on, which do not appear to have any distinct advantages as regards to the quality of the reproduced sound.

SUMMARY OF THE INVENTION

It is a primary object of this invention to provide a relatively small sized loudspeaker housing or cabinet which provides a broad resonance so as to process a broad band of frequencies.

It is a further object of this invention to provide a basic design of loudspeaker housing unit a plurality of which can be combined in various ways to provide improved overall distribution of sound over large areas of reception.

These and other objects are realized and the limitations of the prior art are overcome in this invention by providing a closed chamber which is in the general shape of a right triangular prism closed at both ends. The sound input to the chamber is by means of a loudspeaker positioned over a circular opening in one of the two walls that form the right angle of the prism. The third wall, which is the hypotenuse of the triangle is directly in line with the speaker output.

With a suitable opening in this wall, the chamber in combination with the opening would form a Helmholz resonator which would accentuate those frequencies within a narrow band, determined by the volume of the chamber and the dimensions of the opening. By making a series of openings of different sizes in the third wall, there will then be resonances (of lesser amplification) at each of a number of frequencies, determined by the sizes of the various openings. By making this series of openings of increasing size a wide band pass of output can be provided with some resonance at all of the intervening frequencies.

Instead of making the series of openings discrete circular openings, the combination can be made in the form of a gap, or opening, of generally exponential widening as a function of length. This exponentially widening gap then serves to provide an infinite series of resonant frequencies which gives the broad tuning of the resonant chamber.

The gap or opening can be cut into the central portion of the third wall preferably with the narrow end of the gap close to the intersection with the first wall, and close to the speaker. The widest portion of the gap then would be at the other edge of the third wall and farthest from the speaker.

Another way of creating this opening is to provide it at the edge of the third wall and this would in a sense cut away one corner of the rectangular third wall and provide the expanding opening as the area between the cut edge of the third wall and the side and top walls of the chamber.

There is a fourth wall, equal in size and shape to the second wall mounted parallel to it and attached at the opposite edge of the first wall. Likewise there can be a fifth wall equal in size to the first wall, joining the fourth and second wall. Furthermore, the top and bottom closures of the triangular prism can be extended as a full top and bottom attached to the four edges of the first, second, fourth and fifth walls. In other words, the third wall then forms a diagonal divider within a right rectangular prism, having the four walls one, two, four and five with rectangular top and bottom plates 6 and 7.

This configuration can be looked on as a right rectangular prism being divided by a diagonal rectangular wall, or a third wall, forming two congruent triangular right prisms. Communication is from the loudspeaker into the first triangular prism, then through the exponential opening, or gap, into the second triangular prism. Then, by removing a part of the enclosure wall around the second triangular prism, the sound can be delivered to the atmosphere. One way would be to remove the fifth wall. Another would be to remove the top or bottom of the second triangular prism, or both the top and bottom. This gives great flexability in positioning the loudspeaker housing to direct sound in any desired direction.

Also it is possible to combine two or more of these housings, each having openings for one speaker, to make a much larger housing with two or more speakers, as will be fully described.

BRIEF DESCRIPTION OF THE DRAWINGS

These and other objects and advantages of this invention and a better understanding of the principles and details of the invention will be evidenced from the following description taken in conjunction with the appended drawings in which.

DETAILED DESCRIPTION OF THE PREFERRED EMBODIMENTS

Figure 1:
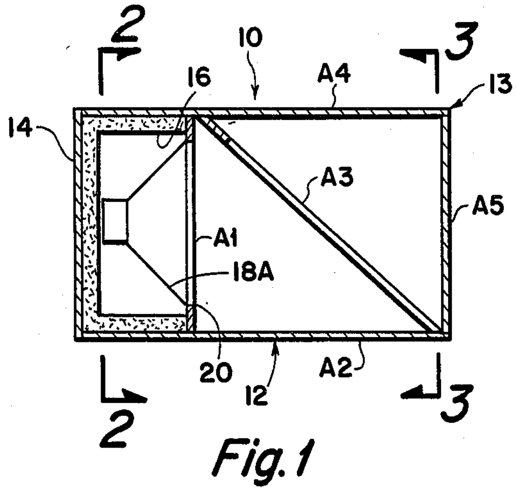
FIGS. 1, 2 and 3 represent three views of one embodiment of this invention.
Figure 2:
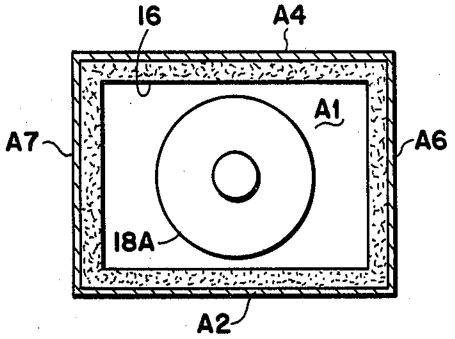
Figure 3:
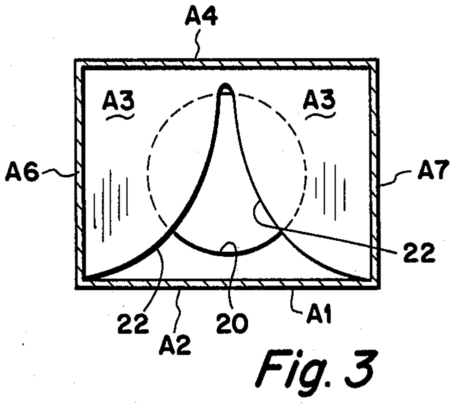

Referring now to the drawings and in particular to FIGS. 1, 2 and 3, there are shown views of one embodiment of this invention.

The complete unit is identified generally by the numeral 10. There is a right triangular prism identified by the numeral 12 having a first wall A1, a second wall A2 and a third wall A3. Walls A1 and A2 are at right angles to each other, and A3 is the hypotenuse wall. A circular opening 20 is provided in one of the two walls A1 or A2 that form the right angle, and a suitable loudspeaker 18A is mounted over the outside wall A1, with the cone of the speaker facing inwardly through the opening 20 towards the third wall A3. A box 14 of suitable size and shape is attached to the first wall, and encloses the outside or back of the speaker 18A. The box is lined with suitable sound absorbing material 16, such as glass wool, as is well known in the art. This is to eliminate interference between the output of the back of the speaker from the output of the front of the speaker.

FIG. 1 shows that the box 14 is made of such a size and shape as to have the base of the box equal in size and shape to the wall A1. Thus, the box forms a right rectangular prism, including the first wall A1.

FIG. 2 is a sectional view of the apparatus of FIG. 1 taken along plane 2—2 of FIG. 1. It shows the back of the loudspeaker 18A centralized in the wall A1, and including the sound absorbing material 16 around the walls A4, A2, A6 and A7.

FIG. 1 shows additionally a rectangular wall A4 equal in size and shape to A2, and a fifth wall A5 equal in size and shape to the first wall. The four walls A1, A2, A5 and A4 combined with the top and bottom plates A7 and A6 form a right rectangular prism which can be turned in various directions so that each of the six walls can be the top wall if so desired. Furthermore, the addition of the box 14 with its walls makes a further extension of the right rectangular prism. A1 then becomes a divider in the rectangular prism.

The wall A3 now forms a diagonal dividing wall across opposite corners of the right rectangular prism A1, A2, A5, A4, and forms two triangular right prisms identified generally by the numerals 12 and 13.

FIG. 3 is a view of the apparatus of FIG. 1 taken along the plane 3—3 just inside of the wall A5. The wall A3 is seen sloping backward towards the top. There is an opening 22 in this dividing wall, or third wall, which is in the form of an elongated gap, having two curved sides 22, each of the curves comprising an exponential curve, providing an exponentially widening gap within the wall A3.

Consider for the moment, that the wall A5 is removed. Then the loudspeaker is delivering acoustic energy into the first triangular prism 12. Acoustical energy in that triangular prism chamber 12 can oscillate or resonate in the manner of a Helmholz resonator, having the chamber volume of 12 and the gap 22 forming the resonating portions. This resonating system delivers acoustic energy into the second triangular prism 13, which is then delivered through the opening uncovered by the removal of wall A5 to the atmosphere. It is possible, of course to remove wall A4 instead of A5, or to remove both A4 and A5.

In FIG. 1 with the addition of walls A4 and A5 the top and bottom plates which initially were considered to close off the first triangular prism 12 can now be considered as rectangular walls covering the space enclosed by the four walls A1, A2, A5 and A4. Thus A6 on one side, and A7 on the other side, would act as enclosing walls out over the ends of both of the triangular prisms, 12 and 13.

It is clear that an opening must be provided in the second triangular prism 13 in order to deliver the acoustic energy to the atmosphere, and that can be done for example in four different ways.

(a) By the removal of wall A5.
(b) By the removal of wall A4.
(c) By the removal of that part of A6 which covers the triangular prism 13.
(d) By the removal of that portion of wall A7 which closes off the other end of the triangular prism 13.

In other words, triangular prism 13 has five walls one of which is wall A3 and any one or portions of any one of the other four could be removed to provide the outlet of sound from the housing.

Figure 4:
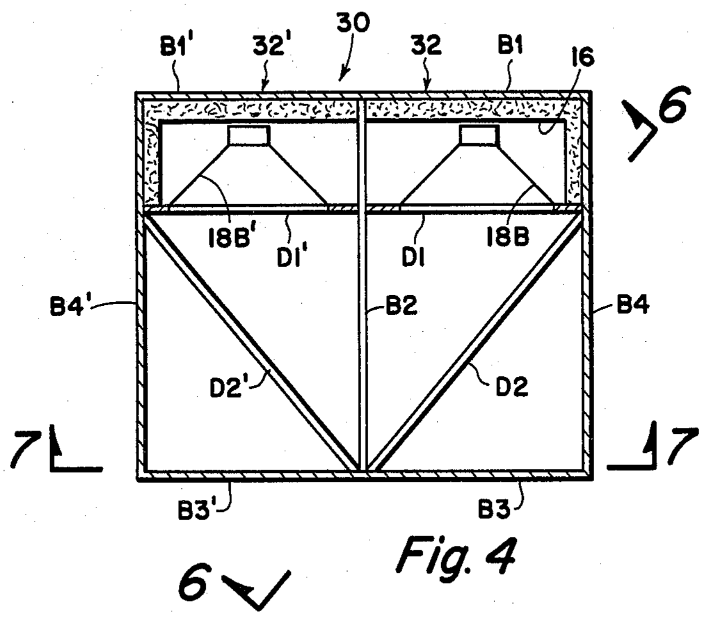
FIGS. 4, 6 and 7 represent another embodiment of the invention comprising substantially two of the embodiments of FIG. 1.

Referring now to FIG. 4 there is shown a loudspeaker housing or cabinet indicated generally by the numeral 30, made up of two separate housings numerals 32 and 32′ respectively. Housing 32 is substantially identical to FIG. 1, and housing 32′ is a mirror image of 32. Housing 32′ can be provided by rotating housing 32 by 180° about an axis passing through the axis of the speaker.

In FIG. 4 the overall structure shown as having a first wall B1 on unit 32 and B1′ on unit 32′. These are coplanar with each other. Then there is a first divider D1 and D1′ which forms the wall previously called A1 and another parallel wall B3 and B3′, which are coplanar forming the wall called A5 in FIG. 1. The diagonal wall called A3 of FIG. 1 is called a second divider D2 and D2′ in FIG. 4. It is clear, however, that the units 32 and 32′ are substantially identical to FIG. 1 in the general formations of the various cavities or chambers, in shapes and sizes, etc.

Figure 7:
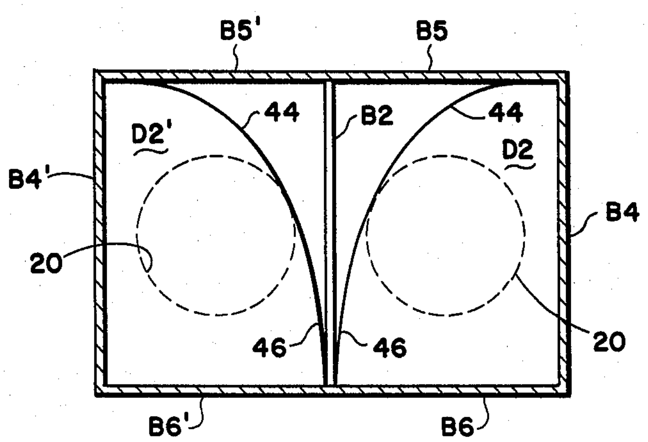

In FIG. 7 there is shown a view of FIG. 4 taken across the plane 7—7 inside of the end wall B3 and B3′. Here the two diagonal walls D2 and D2′ are shown with a different type of exponential gap, which is cut in the form of a curve starting close to the edge of the wall at the portion 44 close to the speaker, and widening as it reaches the other edge which intersects along B2. The shape of the exponential gap shown in FIG. 7 is equivalent to that shown in FIG. 3 and the two are interchangeable in this design of apparatus.

In FIGS. 4 and 7, B2 is the common wall where the two units 32 and 32′ fit together, and form a single dividing wall in larger unit 30. It will be clear, if these two units 32 and 32′ are to be permanently assembled in the form shown in FIG. 4, that the common wall B2 can be removed. Since the acoustical action and wave motion on each side of the common wall B2 are identical and mirror images of each other, the wall can be removed if desired.

Figure 6:
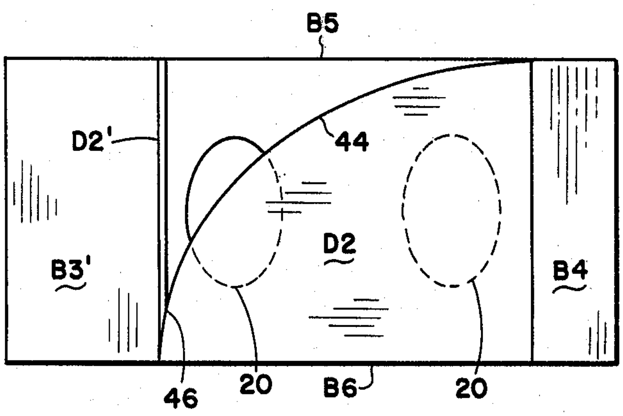

In FIG. 6 is shown another view of the apparatus of FIG. 4 taken along the plane 6—6 of FIG. 4 which again shows the exponentially widening gap in the form of a cut 44 and 46 along the edges of the diagonal walls D2 and D2′.

Figure 5:
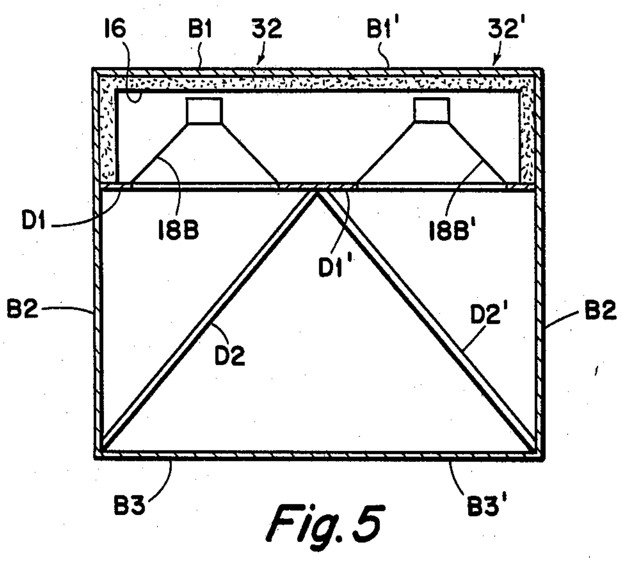
FIG. 5 illustrates an alternative arrangement of FIG. 4.

Referring now to FIG. 5 there is shown a view of FIG. 4 with the two separate units 32 and 32′ exchanged in position as far as right and left is concerned, in FIG. 4, 32 is on the right of 32′ while in FIG. 5 it is on the left of 32′. The action is still the same and is shown mainly in the direction of the diagonal walls D2 and D2′, where they join at the front of the first divider D1, and separate towards the wall B3 and B3′, whereas in FIG. 4 they join at the wall B3 and B3′. As separate units 32 and 32′ they can be put in either of the two positions shown in FIG. 4 or FIG. 5. Again as in the case of FIG. 4, the common wall B4 can be present, or can be removed as desired.

Figure 8:
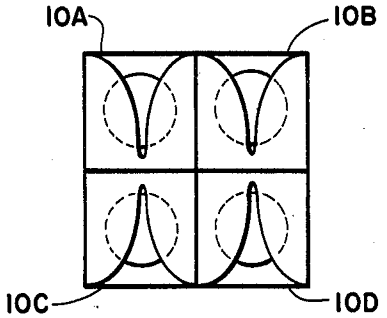
FIG. 8 illustrates an arrangement of four of the units of FIG. 1.

Referring now to FIG. 8 there is shown in schematic fashion, a combination of four of the acoustic housing units as in FIG. 1, arranged in one of many different possible arrangements where their axes as defined by the axes of the loudspeakers are all parallel. The units 10 of FIG. 1 are shown separately as 10A, 10B, 10C and 10D, and of course each of these units can be rotated about its axis by 90° or 180° in either direction. FIG. 8 then corresponds to two units like FIG. 4 set one on top of the other, with the four speakers all pointing with parallel axes.

While FIG. 8 shows 4 units each similar to FIG. 1, arranged with all 4 axes parallel, it will be clear that they can be assembled with their axes arranged in separate selected directions. Also with the assembly as in FIG. 8, each of the 4 units can be arranged with openings in the second triangular prism 13 arranged in different directions, such as by selectively removing side and/or end panels.

All of the walls shown in FIGS. 1, 4 and 8 are indicated as hard boards, and can be made of wood, compressed board or other suitable material, as is well known in the art.

While the invention has been described with a certain degree of particularity, it is manifest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

What is claimed is:

1. A loud speaker housing or cabinet, comprising;

(a) a closed chamber in the form of a first rectangular right prism, having a first wall with its two opposite edges attached to spaced, parallel, second and fourth walls, and a third wall parallel to said first wall and attached at its edges to said second and fourth wall;

(b) a divider wall positioned diagonally inside said four walls from one edge of said first wall to the opposite edge of said third wall;

(c) at least one opening in said first wall and a sound source positioned outside said chamber over said opening, facing toward said divider wall;

(d) a tapered opening in said divider wall of expanding exponential shape, the tapered end of said opening closest to said sound source, and the wider end farthest from said source;

whereby said sound energy is directed into a first of two triangular prismatic volumes, and passes through said opening in said divider into a second identical volume;

(e) side walls covering across the edges of four walls, fully enclose said two volumes; and (f) at least a portion of at least one of said four surfaces enclosing said second triangular prismatic volume open, to permit issuance of sound energy from said second triangular prismatic volume.

2. The loud speaker housing as in claim 1 in which said tapered opening is the central part of said diagonal wall.

3. The loud speaker housing as in claim 1 in which said tapered opening is along one edge of said diagonal divider wall.

4. The loud speaker housing as in claim 1 and including a second identical housing attached to each other, with their second walls in contact.

5. The loud speaker housing as in claim 1, and including a second identical housing attached to each other, with their fourth walls in contact.

6. A loud speaker housing, comprising;

(a) a closed chamber in the shape of a first rectangular right prism, having a first wall with its two edges attached to a second and fourth wall respectively, and the third wall parallel to and of the same size and shape as said first wall joining the second edges of said second and fourth walls;

(b) a first divider parallel to said first wall and spaced a small fraction of the distance to said third wall internally from said first wall, forming a first small right rectangular prism with said first wall and a second large right rectangular prism with said third wall;

(c) a second divider positioned in a diagonal plane inside said second rectangular right prism, forming two adjacent right triangular prisms;

(d) a loud speaker is mounted in said first right rectangular prism over an opening in said first divider, with the output of said speaker facing said second divider;

(e) an opening in said second divider of expanding exponential shape, connecting between said two triangular prisms, with the narrow part of said opening nearest said speaker;

(f) two identical end plates covering said first right rectangular prism, each of said end plates attached to edges of said first, second, third and fourth walls; and (g) at least a part of one of the walls comprising the group of walls including said two end plates and said third and fourth walls removed to provide passage of acoustic energy from said speaker, through said opening in said diagonal divider to the outside of said housing.

7. The housing as in claim 6 in which said opening is a double wing opening cut into the interior portion of said second divider.

8. The housing as in claim 6 in which said opening is cut along two adjacent edges of said second divider.

9. The housing as in claim 6, including at least a second of said housings placed adjacent each other with axes parallel, and having a common wall between them.

10. The housing as in claim 9 including at least a second assembly as in claim 9 placed one on top of the other, to form an assembly of four housings with axes parallel.

* * * * *